(12) United States Patent
Zhao et al.

(10) Patent No.: US 9,881,804 B2
(45) Date of Patent: Jan. 30, 2018

(54) METHOD AND SYSTEM FOR HIGH PRECISION ETCHING OF SUBSTRATES

(71) Applicant: Tokyo Electron Limited, Minato-ku, Tokyo (JP)

(72) Inventors: Jianping Zhao, Austin, TX (US); Merritt Funk, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/006,739

(22) Filed: Jan. 26, 2016

(65) Prior Publication Data

US 2016/0218011 A1    Jul. 28, 2016

Related U.S. Application Data

(60) Provisional application No. 62/107,918, filed on Jan. 26, 2015, provisional application No. 62/137,635, filed on Mar. 24, 2015.

(51) Int. Cl.
*H01L 21/302* (2006.01)
*H01L 21/3065* (2006.01)
*H01J 37/32* (2006.01)

(52) U.S. Cl.
CPC .... *H01L 21/3065* (2013.01); *H01J 37/32715* (2013.01); *H01J 37/32733* (2013.01)

(58) Field of Classification Search
CPC ........... H01J 37/32733; H01J 37/32715; H01J 37/3266; H01J 37/32192; H01J 37/3229;

(Continued)

(56) References Cited

U.S. PATENT DOCUMENTS 5,368,685 A    11/1994    Kumihashi et al.
5,983,829 A    11/1999    Suzuki et al.
(Continued)

FOREIGN PATENT DOCUMENTS

EP    1780777 A1    5/2007
JP    2013191857 A    9/2013
(Continued)

OTHER PUBLICATIONS

International Searching Authority, Search Report and Writtten Opinion issued in counterpart Application No. PCT/US2016/014894 dated Apr. 29, 2016, 12 pp.

*Primary Examiner* — Lan Vinh
(74) *Attorney, Agent, or Firm* — Wood Herron & Evans LLP

(57) ABSTRACT

This disclosure relates to a plasma processing system and methods for high precision etching of microelectronic substrates. The system may include a plasma chamber that may generate plasma to remove monolayer(s) of the substrate. The plasma process may include a two-step process that uses a first plasma to form a thin adsorption layer on the surface of the microelectronic substrate. The adsorbed layer may be removed when the system transitions to a second plasma or moves the substrate to a different location within the first plasma that has a higher ion energy. In one specific embodiment, the transition between the first and second plasma may be enabled by changing the position of the substrate relative to the source electrode with no or relatively small changes in plasma process conditions.

20 Claims, 6 Drawing Sheets

(58) Field of Classification Search
CPC ........... H01L 21/3065; H01L 21/31116; H01L 21/31144
USPC ............... 438/706, 710, 714, 719, 720, 736; 156/345.23, 345.36, 345.38, 345.42
See application file for complete search history.

(56) References Cited

U.S. PATENT DOCUMENTS

| | | |
|---|---|---|
| 7,416,989 B1 | 8/2008 | Liu et al. |
| 7,938,081 B2 | 5/2011 | Chen et al. |
| 8,617,411 B2 | 12/2013 | Singh |
| 2002/0025681 A1 | 2/2002 | Chi et al. |
| 2007/0026540 A1* | 2/2007 | Nooten ................ C23C 16/045 438/5 |
| 2007/0212484 A1 | 9/2007 | Li |
| 2008/0179291 A1* | 7/2008 | Collins ................ B08B 7/00 216/67 |
| 2008/0241419 A1* | 10/2008 | Chua .................... H01J 37/321 427/569 |
| 2009/0023296 A1* | 1/2009 | Nishizuka ......... H01J 37/32192 438/719 |
| 2010/0197113 A1* | 8/2010 | Tsurume ............. H01L 27/1214 438/458 |
| 2011/0061810 A1* | 3/2011 | Ganguly ............. H01L 21/0223 156/345.27 |
| 2011/0139748 A1 | 6/2011 | Donnelly et al. |
| 2011/0177694 A1* | 7/2011 | Chen ..................... G03F 7/2065 438/710 |
| 2012/0098147 A1 | 4/2012 | Takaba et al. |
| 2012/0190211 A1 | 7/2012 | Ueda et al. |
| 2013/0270997 A1 | 10/2013 | Zhao et al. |

FOREIGN PATENT DOCUMENTS

| | | |
|---|---|---|
| KR | 20090106730 A | 10/2009 |
| WO | 2009125951 A2 | 10/2009 |
| WO | 2012108321 A1 | 8/2012 |

* cited by examiner

METHOD AND SYSTEM FOR HIGH PRECISION ETCHING OF SUBSTRATES

CROSS REFERENCE TO RELATED APPLICATIONS

The present application claims the benefit of U.S. provisional patent application No. 62/107,918, filed on Jan. 26, 2015 and 62/137,635 filed on Mar. 24, 2015 which are all incorporated herein by reference in their entirety.

FIELD OF THE DISCLOSURE

This invention relates to semiconductor processing technology, and more particularly, to apparatus and methods for controlling plasma properties for treating a semiconductor substrate.

BACKGROUND

The geometries of microelectronic features continue to scale to smaller sizes and increase in complexity. Accordingly, the patterning techniques used to manufacture microelectronic devices may need to become more precise to create smaller features and minimize damage to the films during manufacturing. Previously, selective etching or high precision etching has been attempted by alternating between precursor deposition (passivation) and etching using plasma processing. However, these conventional approaches have been plagued by aspect ratio, profile variation, and cycle time issues. Accordingly, new high precision etching techniques that may overcome the aforementioned issues may be desirable.

SUMMARY

This disclosure relates to plasma processing methods for high precision etching of substrates used to manufacture microelectronic devices. High precision etching may include the systematic removal of film monolayers over a period time, until a targeted film thickness is achieved or the film is removed from the substrate. High precision etching may be enabled by exposing the substrate to plasma that may be transitioned between an adsorption state and a desorption state. For example, the adsorption plasma may be used to pre-treat or prepare the surface of the substrate that forms a monolayer(s) that has distinguishable characteristics (e.g., etch selectivity) compared to the underlying substrate. Following the formation of the monolayer(s), the adsorption plasma may be transitioned to a desorption plasma that may remove the monolayer(s) to exposed the underlying substrate.

In one embodiment, the adsorption treatment may increase the etch selectivity of the substrate's surface to the underlying substrate. Having a higher etch selectivity at the surface of the substrate compared to the underlying layer may enable the removal or etching of a surface monolayer(s) while minimizing the removal of and/or damage to the underlying substrate during the removal of the monolayer(s). In one embodiment, the etch selectivity between the monolayer and the underlying substrate may be high enough that the removal process may be self-limiting. In this way, the plasma treatment may aggressively or systematically remove the monolayer(s) without removing the underlying layer, in that the plasma treatment appears not to etch or etches a relatively small amount of the underlying layer or substrate despite being exposed to the plasma.

In one embodiment, high precision etching of the substrate may be implemented by transitioning between adsorption and desorption plasma using variety of plasma processing techniques in the same plasma process chamber. The adsorption/desorption transition may be enabled by altering the gas mixture, pressure, power, substrate position, or a combination thereof within the plasma process chamber. For example, the transition may be implemented by exchanging the chemistry of the gas mixture within the plasma process chamber. In one embodiment, the chemistry exchange or transition comprises purging the first chemical composition from the plasma processing chamber prior to introducing the second chemical composition. In one specific instance, the gas purges may completely remove the respective gas mixtures prior to generating the adsorption or desorption plasma. The gas mixture exchange may include shutting off the gas flow and removing the gas mixture or at least a majority of the gas mixture from the plasma process chamber. In another instance, the gas mixture may be transitioned from the first chemical composition to the second chemical composition while maintaining plasma during gas mixture transition. In this embodiment, the gas may be transitioned by ramping down an adsorption chemical constituent and ramping up the flow rate of a desorption chemical constituent at the same time or in a serial or consecutive manner. Additionally, the position of the substrate may vary during the chemical exchange to optimize the adsorption or desorption rate at the substrate's surface. The substrate may be positioned at least 100 mm from a source electrode for the adsorption process and between 20 mm and 100 mm from the source electrode during the desorption process. Additionally, the purging or transitioning of the gas mixtures may be enhanced by injecting the respective gas mixtures adjacent or closer to the respective processing position. For example, the adsorption gas mixture may be injected into the plasma process chamber from a different location than the location of the desorption gas mixture injection point. However, in other embodiments, the different gas mixtures may be injected in to the plasma process chamber from the same locations.

In one embodiment, the adsorption plasma (first plasma or a first region in the plasma) may be generated by applying a first energy source (e.g., microwave) to a process gas mixture in a plasma process chamber. The gas mixture may include a reactant gas (e.g., $Cl_x$-containing gas, $F_x$-containing gas, $O_x$-containing gas, etc.) and a dilution gas (e.g., Ar, He, combinations thereof, etc.) that may be relatively inert to the substrate, when compared to the reactant gas, under the adsorption plasma conditions. The process conditions for the high precision etching method may include, but are not limited to, chamber pressure, source power, gas mixture composition, gas concentration, substrate position, or a combination thereof. In this instance, during adsorption, the chamber pressure may be greater than 1 mTorr and be up to 1000 mTorr and the first energy source may apply a power between 500 W and 10,000 W at a frequency of about 2.45 GHz or within a range of 300 MHz to 10 GHz to a source electrode disposed in the plasma processing chamber.

In this embodiment, the transition to a desorption plasma (second plasma or second region in the plasma) may occur by varying the gas mixture, source power, and/or substrate position to generate ions that may selectively remove portions (e.g., monolayer(s)) of the substrate treated or formed by the adsorption plasma. The desorption plasma may have very high selectively between the adsorbed layer and the underlying layer. In this way, the desorption plasma may remove the adsorption layer without removing the underlying layer. Following the removal of the adsorbed portion of the substrate, the desorption plasma may transition back to an adsorption plasma that treats newly exposed portions or surface of the substrate.

In certain embodiments, the transition between the adsorption and desorption plasma may occur in an asymmetrical manner, such that adsorption plasma or the desorption plasma may be exposed to the substrate for different times. The amount of time that it takes to transition may also vary depending on the any purging or gas exchanging that may be needed between the two treatments, but the purging may not be required. In one specific embodiment, the transition between adsorption and desorption may be implemented by changing the distance between the substrate and the source electrode. For example, plasma characteristics may vary between different regions of the same plasma, such that no changes or small changes in process conditions (e.g., chemistry, power, pressure, etc.) may alter plasma characteristics sufficiently to transition between adsorption and desorption conditions within the process chamber. Hence, the position of the substrate relative to the source electrode may play a dominant role in with enabling high precision etching.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

Figure 1:
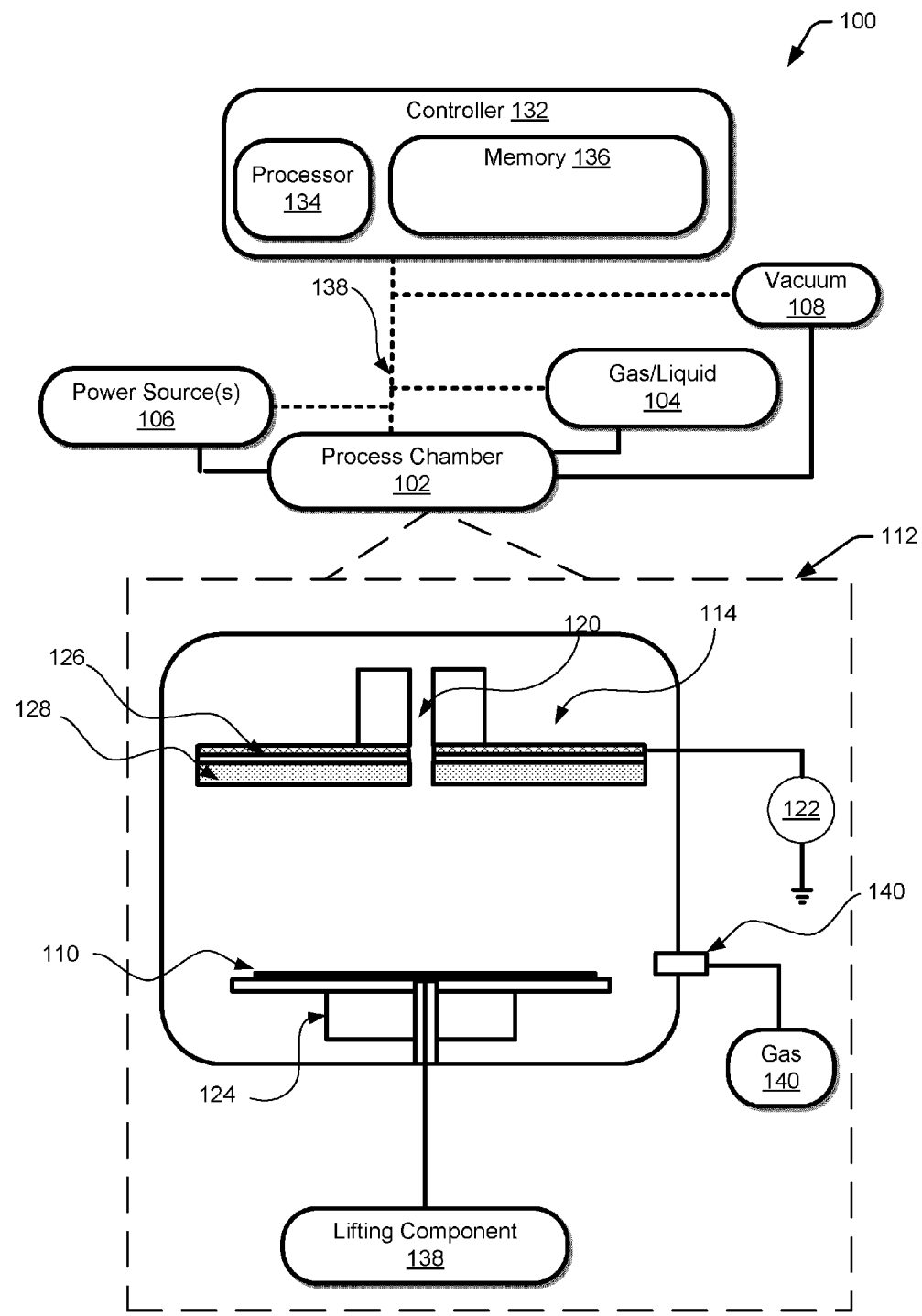
FIG. 1 is an illustration of a representative embodiment of a plasma processing system that shows a schematic cross-sectional illustration of a plasma chamber that may enable the transition between a first plasma and a second plasma to treat a substrate according to at least one embodiment.

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

"Substrate" or "Microelectronic substrate" as used herein generically refers to the object being processed in accordance with the embodiments described herein. The microelectronic substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

Plasma generation may be done by applying electromagnetic energy to an electrically neutral gas to cause electrons to be released from gas molecules that are positively charged (e.g., ion) as result of the lost electron. The ions may be characterized as a molecule or atom where the total number of electrons are not equal to the total number of protons resulting in a positive charge. Molecular or atomic radicals (e.g., molecules or atoms with at least one unpaired electron) may also be generated from the electrically neutral gas. Generally, the radicals may have a neutral, positive, or negative charge and may have high chemical reactivity relative to the ions. Over time, the electromagnetic energy and the increasing electron collisions within the gas mixture may increase the density of ionized molecules and radicals within the gas mixture that may be used to treat a substrate placed in the plasma chamber. The ions and radicals may interact with the substrate or treat the substrate through deposition or passivation that alters the surface of the substrate or that may remove a portion of the substrate following the deposition or passivation.

A plasma processing system may be used to implement several different types of plasma that may be used to etch patterns into or remove portions of the substrate to manufacture electronic devices. As the size and complexity of electronic devices increases, the need for highly selective etch processes that do not damage structures on the substrate has increased. One approach to higher selectivity may include using self-limiting layer etch processes that may alternate between precursor deposition steps (e.g., deposition, oxidation, passivation, etc.) and the removal of the precursor layer. In one specific embodiment, the initial surface treatment may be an adsorption process in which an atoms or molecules permeate or diffuse into the surface of the substrate. The adsorption process may alter one or more monolayers of the surface of the substrate, such that the monolayer(s) are more easily removed or etched away from the substrate during a subsequent process. One exemplary subsequent process, may include a desorption process that may be used to remove monolayer(s) without damaging the underlying substrate. The combination or the transition between adsorption and desorption may enable the removal of the monolayer(s) of the substrate in a controlled or highly selective manner. The plasma processing system may implement one or more methods to alternate between adsorption and desorption processes within the plasma chamber.

FIG. 1 depicts a representative plasma processing system 100 for treating substrates using plasma (not shown) that may be generated in a plasma chamber 102. The plasma processing system 100 may alter certain process conditions to influence the amount of flow of ions and/or radicals towards the substrate. For example, the ionized molecules may be influenced by potential differences within the plasma chamber 102, such that the ionized molecules (or atoms, or radicals) may be directed towards a substrate 110. A person of ordinary skill in the art may control the gas mixture composition, pressure, power, substrate position, or a combination thereof to treat the substrate 110. For example, plasma may be generated by applying electromagnetic energy (e.g., power sources 106) to a process gas mixture that may be provided by a gas delivery system 104 and maintained at a desired pressure by a vacuum system 108. A person of ordinary skill in the art of plasma processing would comprehend the components and sub-systems used to generate plasma within the plasma chamber 102 and may arrange them in any configuration that may enable the embodiments disclosed herein.

In one embodiment, the plasma processing system 100 may include a gas delivery system 104 and a vacuum system 108 that may be in fluid communication with the plasma chamber 102. The gas delivery system 104 may include mass flow controllers, check valves, and the like to be used to control gas mixture distribution and concentration within the plasma chamber 102. The mass flow controllers may control the amount and types of gases that would be provided to the plasma chamber 102. Mass flow controllers are well known in the art of plasma processing. The vacuum system 108, in conjunction with the gas delivery system 104, may be used to control the plasma chamber 102 pressure. A person of ordinary skill in the art may use one or more pumps (not shown) and control systems (e.g., $N_2$ ballast system, butter-fly valve system) (not shown) to control the pressure within the plasma chamber 102. The types and amounts of gases and pressures that may be used in the plasma chamber 102 will be described in the method embodiments of this application.

This embodiment may also include one or more power sources 106 may be used to energize the gas mixture to generate plasma at a desired pressure. The energy may be transferred to the gas mixture via electrodes or antennas that transmit electromagnetic energy generated by the power source 106. In one embodiment, the plasma chamber 102 may include a source electrode 126 that may be used to condition plasma to exhibit desired characteristics on the substrate 110. The types of power sources 106 may include radio frequency (RF) power sources, microwave power sources, magnetic sources or a combination thereof. In other embodiments, the plasma chamber 102 may include a single source, such as the source electrode 126. The powers sources 106 may also include a matching system (not shown) that may be used to maximize power transfer to the gas mixture. A person of ordinary skill in the art would use the matching system to match the impedance of the plasma chamber 102 to impedance of the power source 106. The power and frequency provided by the power source(s) 106 will be described in the embodiments disclosed herein.

In one embodiment, as shown in the cross section illustration 112, the plasma chamber 102 may include a power source assembly 114 that may enable the transmission of electromagnetic energy and the gas mixture (not shown) into the region proximate to the substrate 110. The power source assembly 114 may include a source electrode 126 and a dielectric component 128 that may be disposed around the gas pathway 120. The dielectric component 128 may include a quartz plate that may prevent the gas mixture from physically contacting the source electrode 126. However, the dielectric component 128 may still allow the transmission of electromagnetic energy to the gas mixture. In one embodiment, the electromagnetic energy may form a standing wave between the electrode and the dielectric component 128. The standing wave may induce current flow within the gas mixture to generate plasma that may be used to treat the substrate 110. A person of ordinary skill in the art of plasma processing would be able design the system 100 and the process conditions to enable the standing wave to generate plasma.

In another embodiment, the source electrode 126 may include an antenna plate that may be arranged in a way that enables current to flow around the power assembly 114 in a plane that may substantially parallel to the substrate 110. The current may be induced to flow between a RF power source (not shown) and the ground terminal (not shown) along a low impedance path (e.g., metal layer) and generate a magnetic field (not shown) around the low impedance path that may be used to generate plasma in the plasma processing region generate plasma in a region above and transmit plasma to the plasma processing region. In another exemplary embodiment, the plasma processing system may also include a second power source that may be used in conjunction with the first source. For example, the second source may bias the substrate holder 124 and influence the plasma characteristics proximate to the substrate 110. In some embodiments, the second power source and the source electrode power source 122 may be operated in unison or alone to generate plasma that may be exposed to the substrate 110.

The biasing of the substrate holder 124 and the power assembly 114 may be implemented by using a controller 132 that may coordinate the process sequencing that enables plasma generation within the plasma chamber 102. The controller 132 may use a computer processor 134 and memory 136 to execute computer-readable instructions that may be provided over an electrical communication network 138 to control the plasma processing system 100 components (e.g., power sources 106, gas delivery 104, etc.). The one or more computer processors 134 may include, without limitation: a central processing unit (CPU), a digital signal processor (DSP), a reduced instruction set computer (RISC), a complex instruction set computer (CISC), a microprocessor, a microcontroller, a field programmable gate array (FPGA), or any combination thereof. The memory 136 may include one or more computer-readable storage media ("CRSM"). In some embodiments, the one or more memories may include non-transitory media such as random access memory ("RAM"), flash RAM, solid state media, and so forth. Broadly, the controller 132 may control the sequencing of processing events that enable plasma generation or to transition between different types of plasma that may be exposed to the substrate 110.

For example, the system 100 may form one or more plasma regions within the plasma chamber based, at least in part, on the gas mixture concentration and energy distribution between the source electrode 126 and the substrate chuck 124. For example, the ion concentration may be higher closer to the source electrode 126, such that plasma may have different characteristics (e.g., ion energy, ion concentration) than closer to the substrate chuck 124. For example, plasma closer to the source electrode 126 may have more etch or desorption qualities with more energetic ions that may be more likely to remove a surface layer(s) from the substrate 110. The ion energy may dissipate as a function of distance from the source electrode 126, such that the ions (and radicals) are more likely to passivate or be adsorbed into the substrate 110. The adsorbed ions (and radicals) may penetrate a discrete distance within the substrate 110 to generate an absorbed layer (not shown) that may be a self-limiting etch layer that may demonstrate a relatively higher etch selectivity when the substrate 110 is positioned closer to the source electrode 126. The substrate 110 may be moved within the plasma chamber 102 using a lifting component 138 which may include, but is not limited to, any mechanical, pneumatic, magnetic, and/or electrical means to move the substrate 110 away from or towards the source electrode 126 or away from or towards the substrate chuck 124. For example, the lifting component 138 may include a substrate support (not shown) where the substrate 110 may be placed in the plasma chamber. The substrate support may be coupled to the lifting component 138 that may move the substrate 110 in the vertical direction or towards or away from the source electrode 126.

In other embodiments, the gas mixture provided to the plasma chamber 102 may also be changed in conjunction with the change in substrate 110 position to transition between adsorption and desorption. Plasma chemistry may be introduced into the plasma chamber 102 from one or more different locations depending on whether the substrate 110 may receiving an adsorption or desorption treatment. For example, a secondary gas injection points may be distributed at different locations around the chamber and may inject gas depending on the position of the substrate 110 and/or whether an adsorption or desorption treatment is desired. In the FIG. 1 embodiment, the secondary gas injection point 140 may be located adjacent to the substrate 110 or the substrate chuck 124. Placing the secondary gas injection point 140 closer to the substrate than the gas pathway 120 in the power source assembly may reduce the amount of time needed to reach the substrate 110 and may enable a quicker transition between different process or plasma conditions. The transition may also occur quicker by changing the position of the substrate 110 in conjunction with injecting different chemistry towards the substrate 110 from different locations within the plasma chamber 102, as shown in one representative embodiment illustrated in the FIG. 2.

Figure 2:
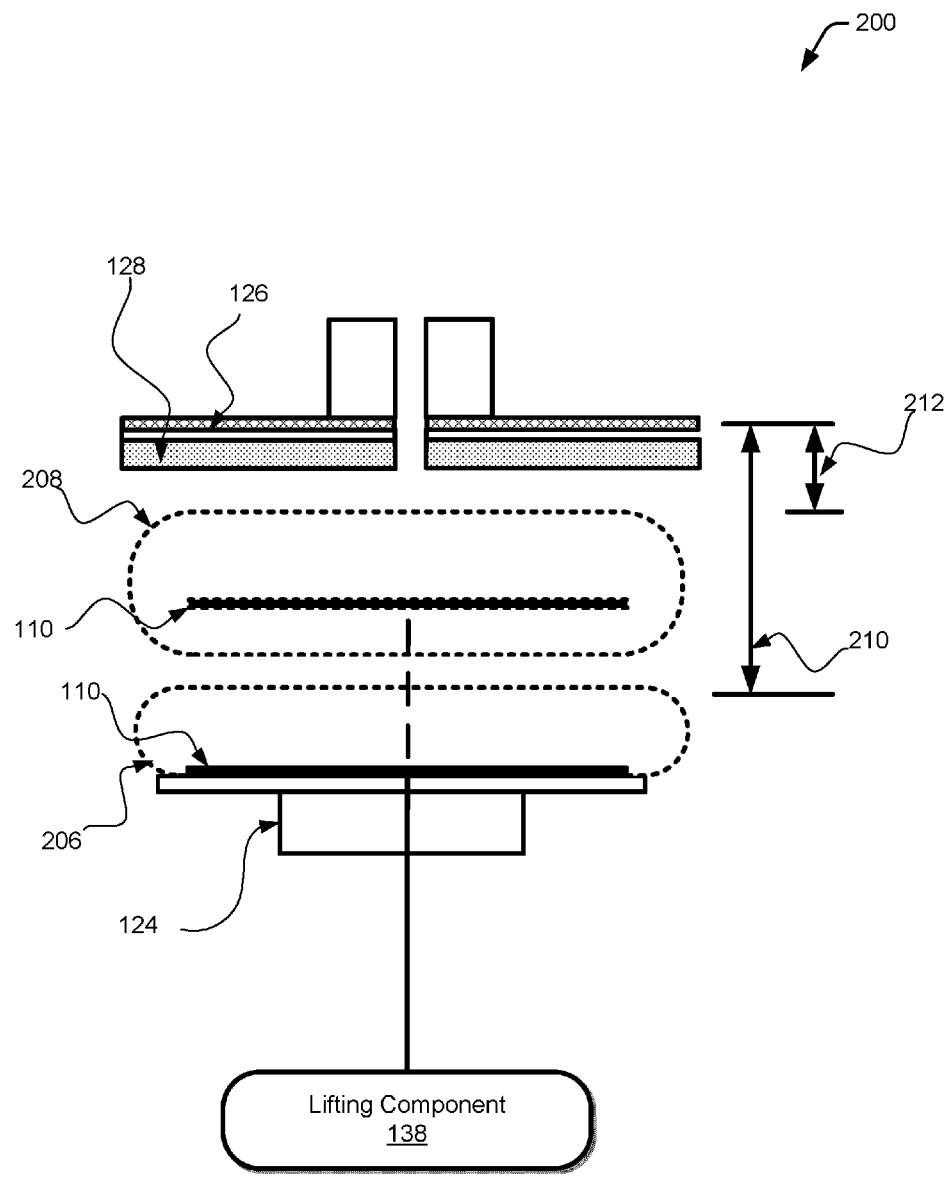
FIG. 2 is a cross-section illustration of the plasma processing system that shows a schematic cross-sectional illustration of a plasma chamber that may enable the transition between a first plasma region and a second plasma region to treat a substrate according to at least one embodiment.

FIG. 2 illustrates one cross-section embodiment 200 of the plasma processing system 100 that transitions the substrate 110 between two different positions within the plasma chamber 102. One issue with high precision etching may include the amount of time to transition between adsorption and desorption plasma conditions. In previous implementations, high precision etching may have included pumping and purging the plasma chamber 102 to transition between an adsorption-capable chemistry and the desorption-capable chemistry. However, the amount of time to purge the plasma chamber 102 was much higher than the adsorption/desorption process times due to the thin layers that were being formed or etched. Hence, any reduction in the transition time would be desirable for high precision etching processes. For example, the process chamber 102 and process conditions may be optimized to generate a single plasma volume in which adsorption and desorption regions exist, such that the different regions of the plasma volume may enable the formation of an adsorbed layer on the substrate 110 and subsequent removal of the absorbed layer. The process chamber 102 or substrate chuck 124 may be configured to move the substrate 110 between the different regions of the plasma volume.

One approach to reduce the transition time may be to use one set of process conditions (e.g., chemistry, power, pressure, etc.) and may use a single power source (e.g., source electrode 126) to perform the adsorption and desorption processing. For example, under one set of process conditions, the ion energy may vary within the process chamber 102 between the source electrode 126 and the substrate chuck 124. The process conditions may be optimized to maintain a first ion energy within a first plasma region 206 and a second ion energy within a second plasma region 208. For example, the ion energy in the first plasma region 206 may be tuned to make adsorption at the substrate 110 more likely in the first plasma region and the ion energy in the second plasma region 208 may be optimized to desorb the layer that was formed in the first plasma region 206. FIG. 2 is intended to show one embodiment of the first plasma region 206 and the second plasma region 208 and how the substrate 110 may be moved between the two regions. The lifting component 138 may comprise any lift system that may be used to move the substrate 110 between the substrate chuck 124 and the source electrode 126. The lifting component 138 may include, but is not limited to, pneumatic, electric, or mechanical means that may change the location of the substrate 110 relative to the substrate chuck 124 or the source electrode 126. In the FIG. 2 embodiment, the lifting component 138 may enable the movement of the substrate 110 between the first plasma region 206 and the second plasma region 208 and from the second plasma region 208 back to the first plasma region 206. Broadly, the difference between the plasma regions may be influenced by differences in process conditions or plasma characteristics that may be based, at least in part, on distributions of applied electromagnetic energy (e.g., from the source electrode 126), chemistry (e.g., from the gas injection port(s) (not shown), and/or pressure within the plasma chamber 102 as a function of distance between the substrate 110, the source electrode 126, the gas injection ports 140, and/or vacuum port(s) (not shown). For example, variation within the plasma chamber 102 using a single set of process conditions (e.g., source power, chemistry, and/or pressure) may enable different plasma characteristics within the chamber, such that the ion energy may be higher closer to the source electrode 126 and may be lower near the substrate chuck 124.

In one embodiment, the transition between the two plasma regions may be characterized by the changes in ion energy. For example, the difference between the first plasma region 206 and the second plasma region 208 may be a difference of at least 0.5 eV, more particularly 0.5 eV to 100 eV. However, another way to define the location of the plasma regions may be through empirical means by measuring the adsorption rate and the desorption rate on the substrate 110 at different locations from the source electrode 126. A person of ordinary skill in the art may conduct experiments using various process conditions (e.g., power, pressure, chemistry, etc.) to determine locations within the plasma chamber 102 that are more capable of generating desirable process results for high precision etching, such that the distance of the substrate 110 from the source electrode 126 may be optimized for an adsorption process or a desorption process. For example, the first region distance 210 from the source electrode 126 to the upper portion of the first plasma region 206 may be determined by adsorption rate and/or quality of the adsorbed layer (not shown). In this embodiment, the adsorption process may be enabled when the substrate 110 is at least farther from the source electrode 126 by the first region distance 210. In one embodiment, the first region distance 210 may be at least 100 mm, more particularly between 100 mm and 200 mm. Likewise, the second plasma region 208 may be within a second region distance 212 of the source electrode 126. In one set of embodiments, the second region distance 212 may be within 100 mm of the source electrode 126, more particularly between 20 mm and 100 mm. However, these embodiments do not imply or require that the adsorption process is uniform throughout the first plasma region 206 or that the desorption process is uniform throughout the second plasma region 208 or that each of the regions are confined to exist exclusively above or below the first region distance 210.

In certain embodiments, the distance of the substrate 110 from the source electrode 126 may be able to strongly distinguish between an adsorption region and the desorption region, such that the adsorption process and the desorption process may share the same or similar process conditions (e.g., power, pressure, chemistry, etc.). In this instance, the transition between an adsorption and a desorption process on a surface of the substrate 110 may be dominated, or highly influenced, by the substrate's 110 distance from the source electrode 126. However, in certain instances, the transition may also be enabled by making slight changes in the process conditions in addition to the change in distance from the source electrode 126.

In one particular embodiment, one or more of the process conditions may vary up to about 5% between the adsorption and desorption processes. In another embodiment, the adsorption process and the desorption process may use different process conditions (e.g., power, pressure, chemistry, etc.). In one particular embodiment, one or more of the process conditions may vary by up to 20% between the adsorption and desorption processes or that additional gases may be injected proximate to the substrate 110. The substrate's 110 distance from the source electrode 126 may optimized to limit exposure to the additional gas (e.g., gas port 140), such that gas is less likely to reach the front side surface of the substrate 110. The front side surface being directly opposite the source electrode 126. The combination of the substrate 110 location change with positioning of the gas injection ports (not shown) may enable a quicker transition between adsorption and desorption than typical pumping and purging techniques used in the past. These process changes may also incorporate changes in power and pressure to optimize the adsorption or desorption process. These aforementioned process conditions mentioned in the description of FIG. 2 will be described in greater detail in the descriptions of FIGS. 3-6.

It should be noted that FIG. 2 merely illustrates the plasma regions for the purpose of illustration of localized differences of plasma characteristics within the plasma chamber 102. The size and locations of the plasma regions are not intended to be limited to the size and scale as shown in FIG. 2.

Figure 3:
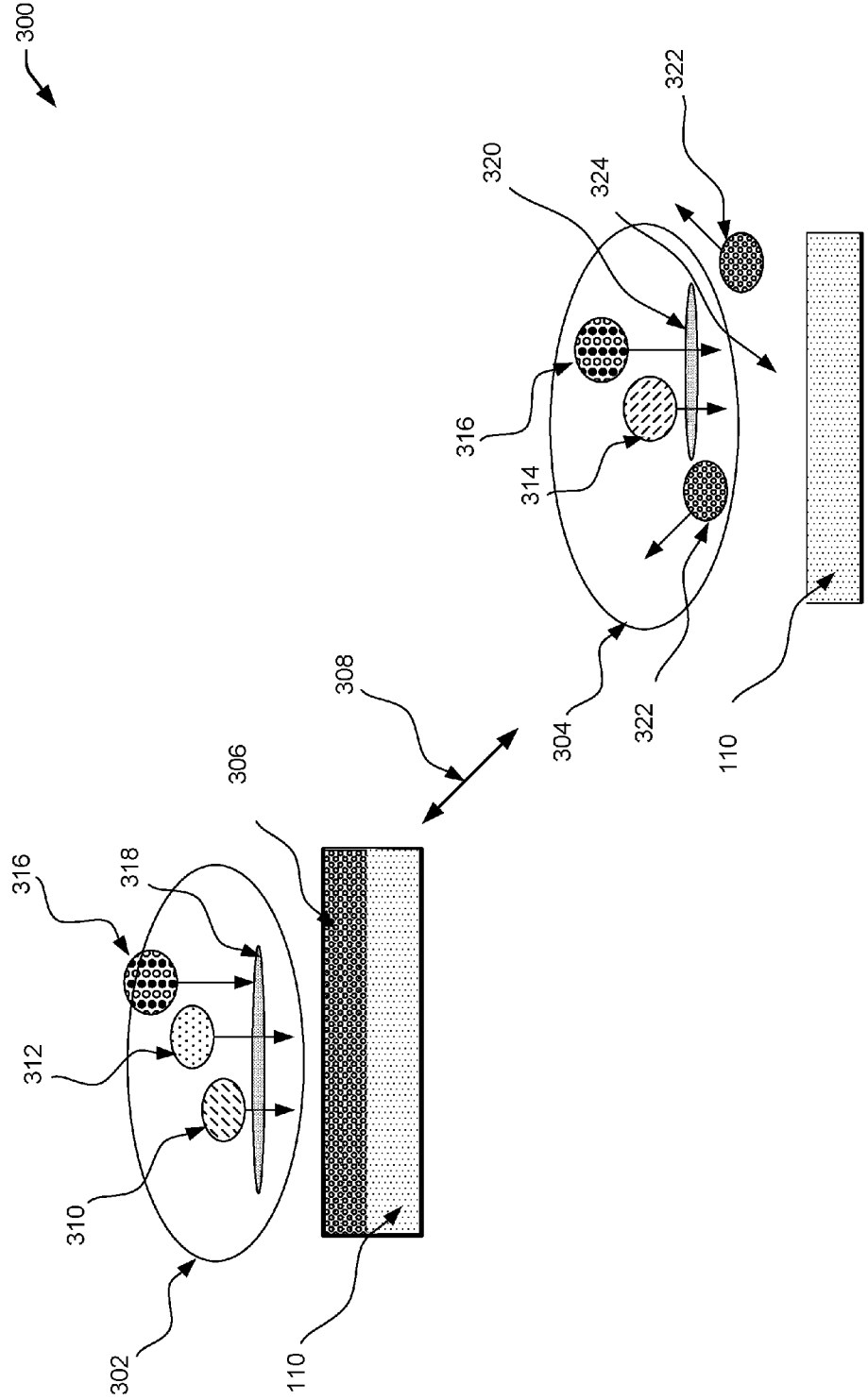
FIG. 3 is a diagram illustrating the transition between the first plasma and the second plasma in view of the ion energy and a sticking coefficient according to at least one embodiment.
Figure 4:
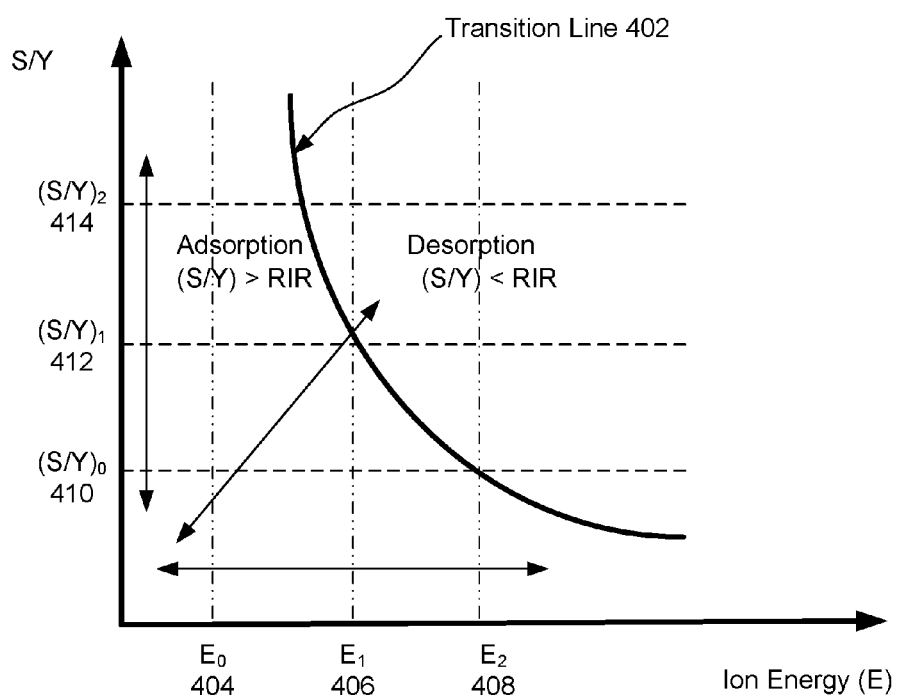
FIG. 4 is an illustration of a representative embodiment of the first plasma and the corresponding substrate treatment and of the second plasma and the corresponding substrate treatment.

FIGS. 3 & 4 include illustrations intended to describe the high precision etching process that incorporates a combination of adsorption and desorption properties to remove monolayer(s) from the substrate 110. In one embodiment, the high precision etching process may be implemented by forming a self-limiting layer on the surface of the substrate 100 using adsorption process, followed by removing the adsorbed layer using a desorption process. The adsorbed layer 306 may be considered self-limiting based, at least in part, on the relatively high etch selectivity between the adsorbed layer and the underlying substrate 110. During the adsorption process a thin layer (e.g., monolayer(s)) may be formed on the substrate 110, such that the layer may be formed using a portion of the substrate 110. The adsorption plasma may include atoms, ions, and/or molecules that alter the composition of the exposed surface of the substrate 110 to form the adsorbed layer 306. Under the theory of chemisorption, the atoms, ions, and/or molecules may bond or adhere to the surface, such that a thin layer (e.g., monolayer(s)) of the substrate 110 may be consumed or altered to have a relatively higher etch selectivity when exposed to the desorption plasma. Following the formation of the adsorbed layer 306, the adsorption plasma may transition to a desorption plasma, as will be described in the description of FIGS. 3 & 4. The desorption plasma may bombard the adsorbed layer 306 with ions that selectively remove the adsorbed layer to expose the underlying substrate 110. The high precision etching process may iterate between the adsorption and desorption process until a desired amount of the substrate 110 has been removed.

FIG. 3 is an illustration of a representative embodiment 300 of a first plasma 302 (e.g., adsorption) treating the substrate 110 and a second plasma 304 (e.g., desorption) treating the substrate 110. The plasma processing system 100 may implement one or more methods to transition between the first plasma 302 and the second plasma 304, as indicated by the double-headed arrow 308. The first plasma 302 may be used to form an adsorbed layer 306 on the substrate 110 and the second plasma 304 may be used to remove the adsorbed layer 306 to expose the underlying substrate 110.

As noted in the description of FIG. 1, the plasma processing system 100 may apply electromagnetic energy to the gas mixture within the plasma chamber 102 to generate the first plasma 302 and/or the second plasma 304. The gas mixture may include reactants gases, dilution gas, or a combination thereof. The reactant gases may be more likely to generate ions and radicals and the dilution gas(es) may be more likely to form ions than radicals, if at all. However, when the gas mixture includes both types of gases there may be a combination of ions and radicals from different gases. The plasma processing system 100 may optimize various process conditions to control ion flux and/or radical flux used to treat the substrate 110. In addition to the parameters illustrated in FIG. 4, ion flux may play a role in determining whether an adsorption or desorption plasma is exposed to the substrate 110. The formation of the ions and radicals will be briefly described below along with a brief explanation of flux.

In the adsorption embodiments, the gas mixture may include reactant gas or a combination of reactant gas(es) and dilution gas(es). The reactant gas may include, but is not limited to, an oxygen-containing gas, a nitrogen-containing gas, a hydrogen containing gas, a carbon containing gas, a halogen-containing gas, or any combination thereof. The dilution gas(es) (e.g., argon, helium, etc.) may include a chemically inert species that may be inert relative to gases or materials within the plasma chamber 102. The gas mixture may vary between 100% reactant gas(es) by volume down to 10% by volume for the adsorption embodiments. In one specific embodiment, the gas mixture may include between 80%-100% by volume of the reactant gases (e.g., $Cl_2$) with the remainder being one or more dilution gases.

In one adsorption embodiment, the first plasma 302 may include adsorbing radicals 310 and adsorbing ions 312 that may generated by exposing the gas mixture to electromagnetic energy. In the combination gas mixture embodiment, the first plasma 302 may also include dilution ions 310. Ideally, the radical flux towards the substrate 110 will dominate the ion flux and enable the formation of the adsorbed layer 306 on the substrate 110. In one embodiment, the adsorbed layer 306 may include a composition of the atoms and/or molecules from the gas mixture and the substrate 110 (e.g., Si). Following the formation of the adsorbed layer 306, the plasma processing system 100 may transition to the second plasma 304 to etch the adsorbed layer 306 and expose the underlying substrate 110.

In the desorption embodiments, the second plasma 304 may include desorbing ions 316 and may or may not include desorbing radicals 314. For example, when the gas mixture includes only dilution gas(es), then the desorbing radicals 314 may not be present. However, radicals may be present when reactant gas is present in the plasma chamber 102 during the desorption process. In contrast to the adsorption process, the desorption ion flux may be much high, therefore the desorption effects may dominate any adsorption effects at the substrate 110.

Although both plasmas may include ions and/or radicals, they may be used for different purposes. For example, the ion energy during adsorption may be less than 20 eV, while the ion energy during desorption may be greater than 20 eV. Further, the adsorbing ion flux may be lower than the desorbing ion flux The ion flux values may be measured in the plasma processing regions proximate to the substrate 110 using the flux surface areas (e.g., adsorption flux surface area 318 or desorption flux surface area 320) that may be near the center of the substrate 110 and proximate to the substrate 110 surface.

Broadly, flux may be considered the flow rate of ions or radicals as they move through a flux surface area and have the units of a physical property per unit of area. Ion flux ($\Gamma_i$) and radical flux ($\Gamma_r$) may have the units of atoms/cm$^2$ and may represent the quantity or concentration of ions or radicals that cross the adsorption surface area 318 or desorption surface area 320 and may collide with the substrate 110. The ions and radicals may be attracted to the substrate 110 depending on the potential difference between the plasma and the substrate, energy, charge, process pressure, process temperature, or any combination thereof.

In one adsorption embodiment, the process gas mixture may include a reactant gas (e.g., halogen, oxygen) and a dilution gas (e.g., argon, helium, or combination thereof). The adsorption radicals 310 may be used to form the adsorbed layer 306 via deposition or passivation as known by a person of ordinary skill in the art. Ideally, the $\Gamma_r$ may be higher than the $\Gamma_i$ to enable the adsorption rate to be higher than the desorption rate at the substrate 110. The radical flux ($\Gamma_r$) and/or ion flux ($\Gamma_i$) may be measured near or at the center of the substrate 110 $\Gamma_i$ and proximate (e.g., <10 mm) to the surface of the substrate 110 using any known technique to measure $\Gamma_r$ or $\Gamma_i$. Examples of the known techniques, may include, but are not limited to, absorption probes, Langmuir probe, hairpin probes, a retarding field energy analyzer, optical emission spectroscopy, actinometry, mass spectroscopy, or any combination thereof.

The first plasma 302 may be generated to minimize the ion energy of the adsorption ions 312 to minimize etching of the substrate 110 relative to the adsorption of the adsorbed radicals 310. In short, the adsorbed layer 306 may be generated when the adsorption rate is greater than the desorption rate at the substrate's 110 surface. The adsorbed layer 306 may be formed when the adsorbed radical 310 energy is less than the nominal bond enthalpy of the gas mixture constituent and the silicon substrate 110. In one specific embodiment, the substrate 110 may include a bulk silicon substrate 110 that may provide the starting material for the generation of the adsorbed layer 306. The first plasma 302 may include a halogen-containing gas (e.g., $Cl_x$, $F_x$) or an oxygen-containing gas (e.g., $O_x$) that generates the adsorbed radicals 310 that may react with the silicon surface through known deposition, passivation, or oxidation techniques.

In another specific embodiment, the substrate 110 may include a patterned structure (not shown) that may include a sidewalls or trenches that protrude from or into the substrate 110. The adsorption process may be tuned to form the adsorbed layer 306 selectively within the trench, such that the adsorption rate at the bottom of the trench may be higher than the adsorption rate on the sidewalls. The adsorbed layer 306 may also be conformally formed on the structure protruding from or into the substrate 110 using the first plasma 302. Adsorption methods will be discussed in greater detail in the descriptions of FIGS. 5 and 6.

Following the adsorption process, the plasma processing system 100 may transition to a desorption process. The desorption ions 316 may be used to remove or etch the adsorbed layer 306 to form a desorbed region 324 formed by the removal of the desorbed molecules/atoms 322 from the substrate 110. Ideally, the $\Gamma_i$ may be higher to enable the desorption rate to be higher than the adsorption rate at the substrate 110. The radical flux ($\Gamma_r$) and/or ion flux ($\Gamma_i$) may be measured near or at the center of the substrate 110 $\Gamma_i$ and proximate (e.g., <10 mm) to the surface of the substrate 110 using any known technique to measure $\Gamma_r$ or $\Gamma_i$ may be used.

In the desorption embodiments, the second plasma 304 may have a higher $\Gamma_i$, such that the desorption rate is higher than the adsorption rate at the substrate 110. Obtaining a higher $\Gamma_i$ may include varying the process conditions, such as, but not limited to, the gas mixture, electromagnetic energy, pressure, or combination thereof. However, all the process conditions are not required to change for the transition between adsorption and desorption to occur. Desorption methods will be discussed in greater detail in the descriptions of FIGS. 5 and 6.

FIG. 4 is a diagram 400 intended to explain the transition between the adsorption process (e.g., first plasma 302) and the desorption process (e.g., second plasma 304) within the context of the ion energy, sticking coefficient(s) of radicals, etch yield (Y), and/or the radical-to-ion flux ratio (RIR) expressed as the ion flux over the radical flux $$\left(\frac{\Gamma_r}{\Gamma_i}\right).$$

FIG. 4 is intended for explanatory purposes and is not intended to provide an all-encompassing model of parameters for monolayer(s) etching. The diagram 400 is intended to demonstrate that the transition between adsorption and desorption may be possible by controlling one or more variables related to plasma generation and the relationship of the components (radicals, ions, etc.) of plasma and how they may be varied to treat the substrate 110 to obtain monolayer(s) etching.

Ion energy may indicate the amount of energy or density of the ions in the plasma processing regions and can be measured using known techniques known to those of ordinary skill in the art. The ratio of $$\frac{S}{Y}$$

may indicate the probability of whether ions and radicals are adsorbing to the substrate 110 or removing portions of the substrate 110. A higher $$\frac{S}{Y}$$

value may indicate adsorption is more likely occurring while a lower $$\frac{S}{Y}$$

value may indicate that desorption is more likely occurring. In some embodiments, when s is large (e.g., adsorption) then Y may likely be relatively low indicating that radical flux may be higher than the ion flux within the plasma processing regions. Hence, deposition or passivation of the substrate 110 may occur at least alter the surface of the substrate 110 to make it different from the underlying substrate 110 with respect etch selectivity. In contrast, in one embodiment, when s is relatively low (e.g., desorption) then Y may likely be relatively high indicating. However, in another embodiment, s may be relatively high (e.g., >0.5) during some desorption processes, however adsorption effects may be minimized due to Y being much higher during the desorption process. In short, the desorption rate may be much higher than any adsorption (e.g., low radical flux) that may be occurring in this embodiment.

In FIG. 4, the transition line 402 indicates where plasma may transition between adsorption and desorption characteristics. In this embodiment, the transition may be described as a function of, but is not limited to, the ion energy proximate to the substrate 100 surface, the sticking coefficient(s) of the radicals, the etch yield (Y) or atoms removed per ion, and RIR. For example, to the left of the transition line 402, plasma is more likely to exhibit adsorption characteristics, such that deposition or passivation may occur at the substrate 110 surface. To the right of the transition line 402, plasma is more likely to remove portions of the substrate 110. Accordingly, the ion energy may be an important factor in controlling the transition between adsorption and desorption and plasma performance within each of the process regions. However, ion energy is not the sole determining factor governing the transition between adsorption plasma and desorption plasma.

In one embodiment, plasma may be described as a combination of radicals and ions interacting with each other and the substrate 110 that may be controlled to achieve a desired result on the substrate 110 surface. For example, the adsorption process may be characterized by what is added to or formed on the surface that increases the etch selectivity of the surface relative to the underlying substrate 110. During the adsorption process, surface coverage by the radicals may be more important than atom removal by energetic ions. Hence, a lower ion energy may be more desirable during with a higher values of $$\frac{S}{Y},$$

as suggested by the transition line 402 in FIG. 4. The RIR $$\left(\frac{\Gamma_r}{\Gamma_i}\right)$$

may also be relatively higher since a higher radical flux ($\Gamma_r$) may be more desirable to obtain more surface coverage in a shorter amount of time. Hence, within the adsorption regime, $$\frac{S}{Y}$$

may be greater man RIR. However, during the desorption process the removal of the surface layer may be a higher priority than surface coverage. Accordingly, it may be desirable to have higher ion energy making the energetic ions more likely to remove surface atoms from the substrate 110. As the ion energy increases, the ion flux ($\Gamma_i$), the RIR, and Y may increase, indicating that the removal of one or more monolayers from the substrate 110 is more likely occurring. As shown in FIG. 4, the adsorption regime (e.g., to the left of the transition line 402) is more likely to exist when $$\frac{S}{Y}$$

is greater than RIR. Likewise, the desorption regime, to the right of the transition line 402, is more likely to exist when $$\frac{S}{Y}$$

is less than RIR. Regardless, the ion flux, during desorption, may be higher than the ion flux during adsorption. It may be possible to transition between the two regimes in a variety of ways.

FIG. 4 illustrates several potential embodiments relating ion and $$\frac{S}{Y}$$

and how it may be possible to transition between adsorption and desorption and where the process margin between adsorption and desorption may be large or small. For example, under the ion energy $E_0$ 404 embodiment, the ion energy may be low enough to allow a wider adsorption process margin that maintains the adsorption regime over a broader variation of $$\frac{S}{Y}$$

from $(s/Y)_0$ 410 up to $(s/Y)_2$ 414. The $$\frac{S}{Y}$$

process margin becomes narrower as the ion energy $E_1$ 406 increases towards ion energy $E_2$ 408, such that desorption may be more likely to occur depending, at least in part, on $$\frac{S}{Y}$$

and RIR. For example, at $(s/Y)_0$ 410 the adsorption regime may dominate when the ion energy is $E_1$ 406 and the RIR may be less than $(s/Y)_0$ 410. However, if the RIR increases to greater than $(s/Y)_0$ 410, then desorption may be more likely to occur and it may be possible to be in the desorption regime with ion energy $E_1$ 406. However, in other embodiments, distinguishing between adsorption and desorption may become more difficult to determine or may have lower adsorption or desorption rates when the process is closer to the transition line 402.

While operating at ion energy $E_2$ 408, it may be more difficult to insure the plasma is consistently operating strictly in the adsorption or desorption regime when $$\frac{S}{Y}$$

is approximately $(s/Y)_0$ 410 or that the adsorption/desorption rates may be slower proximate to the transition line 402. It may not be desirable, but may be possible, to operate under this condition because adsorption/desorption process margin difference is much lower than for other possible conditions. A similar process margin issue may exist at the ion energy $E_1$ 406 and $(s/Y)_i$ 412 embodiment. Ideally, the preferred process may be further away from the transition line 402 than shown under the two previous embodiments. For example, in the $(s/Y)_1$ 412 embodiment, the adsorption process margin may be increased by lowering the ion energy $E_1$ 406 towards ion energy $E_0$ 404 or by decreasing the RIR. In contrast, the desorption process margin may be increased by increasing ion energy $E_1$ 406 towards ion energy $E_2$ 408 or by increasing the ion flux. Although ion energy and $$\frac{S}{Y}$$

provide a strong indication of whether plasma may be operating within the adsorption or desorption regime, they are not solely determinative and may be influenced by other variables (e.g., RIR). For example, the adsorption and desorption regimes may exist simultaneously with the plasma chamber 102 using the same process conditions. In one embodiment, the ion energy may be higher closer to the source electrode 126 and plasma may exhibit desorption characteristics when the substrate 110 is moved closer to the source electrode 126. However, the ion energy may be lower further away from the source electrode 126 in the direction of the substrate chuck 124. Hence, as the substrate 110 is moved away from the source electrode 126 the adsorption characteristics may tend to dominate the changes occurring at the surface of the substrate 110. In other embodiments, the process conditions may also be varied in conjunction with the substrate 110 movement. For example, during the adsorption process the substrate 110 may be located closer to the substrate chuck 124 while reactant gases are introduced into the plasma chamber 102. Following the formation of the adsorbed layer 306, the substrate 110 may be exposed to a higher ion energy or ion density to remove the adsorbed layer 306. As noted above, one approach is to move the substrate 110 closer to the source electrode 126 to remove the adsorbed layer 306. However, the desorption process may be enhanced by reducing the amount of reactant gases close to the substrate 110 and/or increasing ion energy via source power and/or pressure changes. This may include moving the substrate 110 closer to the source electrode 126 and injecting additional gas(es) (e.g., non-reactant gas) into the space between the substrate 110 and the source electrode 126 to decrease the transition time between adsorption and desorption at the surface of the substrate 110. In another embodiment, the transition time between adsorption and desorption processing may be reduced by locating reactant gas inlets closer to the adsorption process location and the vacuum outlet to limit the ability of the reactant gases to migrate towards the source electrode 126 during processing during subsequent desorption processing.

Figure 5:
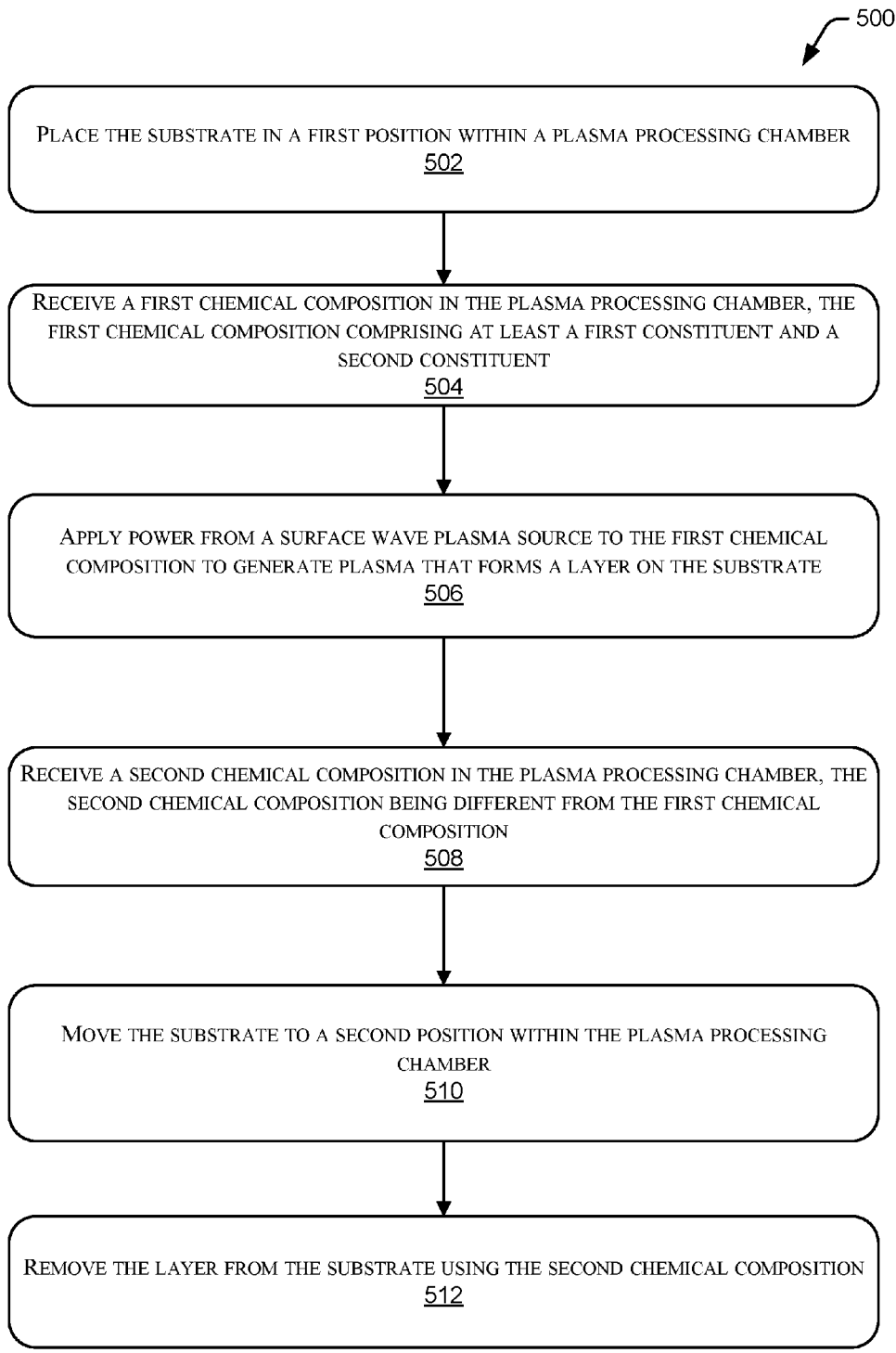
FIG. 5 is a flow diagram for a method for generating a first plasma and a second plasma to treat a substrate according to at least one embodiment.
Figure 6:
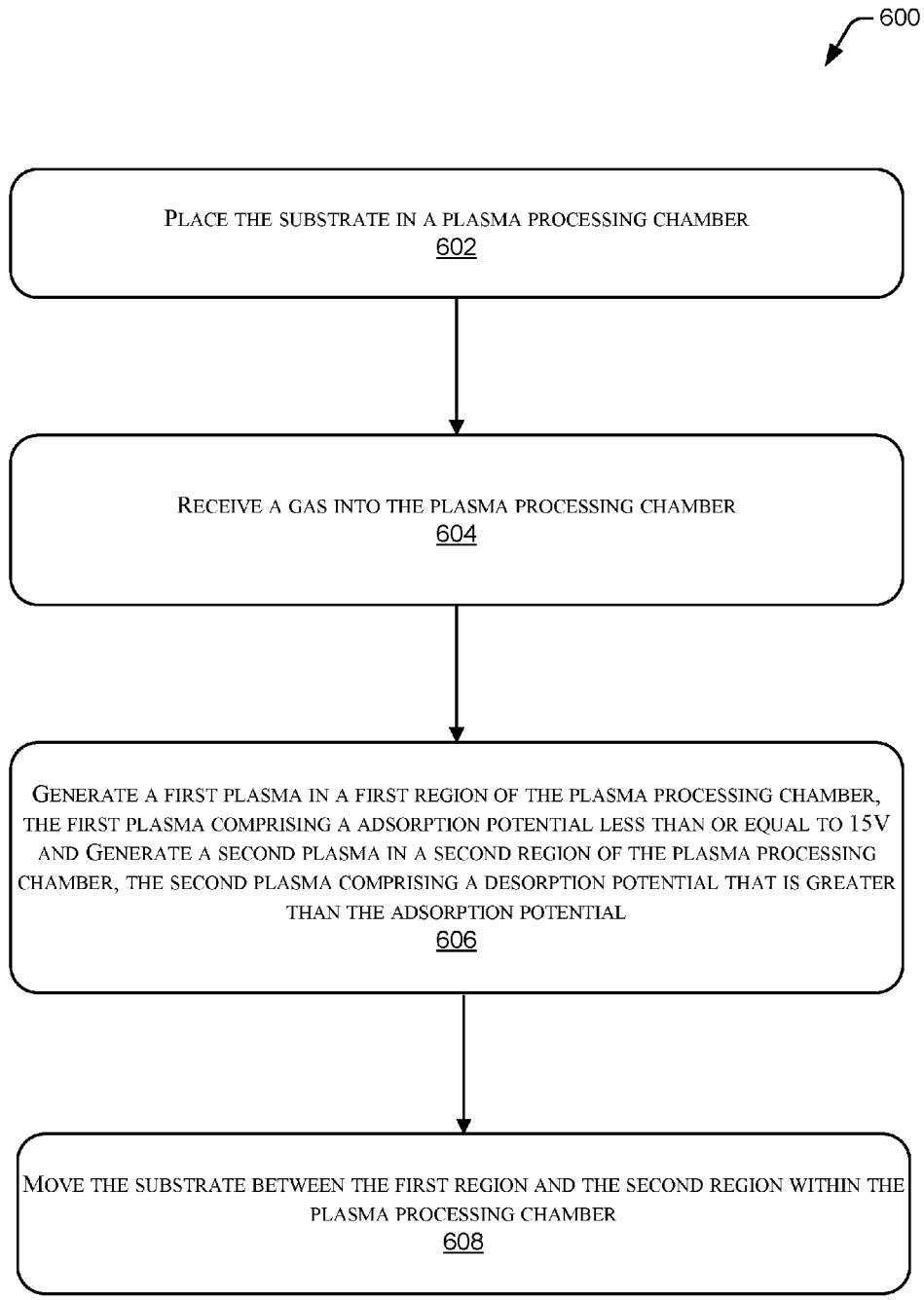
FIG. 6 is a flow diagram for another method for generating a first plasma and a second plasma to treat a substrate according to at least one embodiment.

FIGS. 5 & 6 illustrate methods for removing surface layers of a substrate 110 using an iterative process using the plasma processing system 100 that alternates between an adsorption plasma (e.g., first plasma 302) and a desorption plasma (e.g., second plasma 304). The plasma processing system 100 may control a variety of process and plasma parameters to transition between adsorption and desorption conditions.

In one approach, the adsorption processes may be enabled by a combination of relatively high pressure and high source power (e.g., power to the power assembly 114) that may generate radicals from the gas mixture and produce a higher $\Gamma_r$ that results in a higher surface coverage of the substrate 110 (e.g., adsorbed layer 306). These process conditions may also decrease the first plasma 302 potential to minimize the ion energy or $\Gamma_i$ to prevent desorption during the formation of the adsorbed layer 306. The high pressure/power combination may be able to keep ion energy low, but generate enough radicals to have the adsorption process dominate any desorption effects. Interestingly, all high power techniques may not be equal with respect to ion energy control. It may be advantageous to use microwave power at the power assembly 114, rather than RF power. It has been observed that the efficiency of the electron generation from a microwave source is much better than using an RF power source. For example, the efficiency of the electron generation from the microwave wave or surface wave source is so good at high frequency that the mean electron energy determined by the particle balance (source and loss) in the plasma is lower for the microwave embodiment than RF sources driven at much lower frequencies (e.g., <300 MHz). The microwave embodiment may enable a higher current to the substrate 110 which enables a lower peak to peak voltage (Vpp) at the substrate when compared to RF sources (e.g., ICP, CCP techniques) with the same or similar applied power. Being able to access very low electron temperature (Te) and very low Vpp simultaneously with large ion current is a unique property of microwave sources that affords a unique space high precision etching processes. In this way, microwave sources may enable lower ion energy for the same applied power by RF power sources. Accordingly, similar power profiles between different types of power sources (e.g., microwave or RF) may be distinguishable per the differences in driving frequency, ion energy, or a combination thereof.

The adsorption process may form a thin (e.g., monolayers) adsorbed layer 306 on the substrate 110 by saturating the surface with halogen atoms/molecules or with oxygen atoms/molecules. The adsorbed layer 306 may have a relatively higher degree of etch selectivity compared to the underlying substrate 110, such that the adsorbed layer 306 may have a higher etch rate than the substrate 110. Accordingly, a desorption process may be used to remove the adsorbed layer while minimizing the damage to the underlying substrate 110. The desorption process may include transitioning the ion energy, pressure, gas mixture, or combinations thereof of the first plasma 302 to enable the desorbed ions 316 to etch the adsorbed layer 306.

In one approach, the desorption processes may be enabled by applying electromagnetic energy to the gas mixture to generate the second plasma 304 or by moving the substrate 110 closer to a region in the plasma chamber 102 that has a higher ion energy. The desorption process may also be optimized by making changes to the gas mixture and pressure to adjust the etch rate or etch profile on the substrate 110. Generally, the desorption process may have a higher $\Gamma_i$ compared to the adsorption process and a much lower $\Gamma_r$ or near zero $\Gamma_r$ when the desorption gas mixture may not include reactant gases. The desorption process may be self-limiting due to the etch selectivity between the adsorbed layer 306 and the substrate 110. Following the adsorbed layer 306 removal, the substrate 110 may be removed from the second plasma 304 (e.g., desorption) may be transitioned back to the first plasma 302 (e.g., adsorption) that may be further away from the source electrode 126 than the second plasma 304. This transition between adsorption and desorption may be iterated until a desired portion of the substrate 110 has been removed. Turning to FIG. 5, the method 500 illustrates one embodiment of the adsorption/desorption process described above.

At block 502, the plasma process chamber 102 may receive a microelectronic substrate 110 which may include any type of semiconductor substrate that may include patterned features or elements that may be used to form microelectronic devices. The semiconductor substrate 110 may include, but is not limited to, any single element substrate (e.g., Si), silicon on insulator substrates, III-V substrates, or epitaxial silicon substrates. The substrate 110 may be placed on the substrate holder 124 that may disposed between the power assembly 114 in the substrate holder 124.

In one embodiment, the substrate 110 may be placed in a first position within the plasma chamber 102. As shown in FIG. 2, the substrate 126 may be opposite the source electrode 126 and may be located where adsorption process may dominate the desorption process on the surface of the substrate 110. The adsorption process may likely dominate in the first plasma region as shown in FIG. 2 when the process is initiated. In one embodiment, the first position of the substrate 110 may be at least 100 mm, in a vertical or normal direction, from the source electrode 126. More particularly, in one specific embodiment, the first position of the substrate 110 may be between 100 mm and 200 mm from the source electrode 126.

At block 504, following the position of the substrate 110, the gas delivery system 104 may provide a first gas mixture or chemical composition to the plasma chamber 102. The gas mixture may include at least one reactant gas, dilution gas(es), or a combination thereof that may be used to form an adsorbed layer 306 on the substrate 110. The reactant gas, if used in the first gas mixture, may include at least one chemical element that reacts with the substrate 110 or films on the substrate 110. In one embodiment, the reactant gas may include, but is not limited to, a halogen-containing gas (e.g., $Cl_x$, $F_x$) or an oxygen-containing gas (e.g., $O_x$). In another embodiment, the gas mixture may also include a dilution gas(es) with the reactant gas. The dilution gas may include, but is not limited to, argon, helium, nitrogen, or any combination thereof. In one specific embodiment, the gas delivery system 104 may provide a gas mixture that comprises between 10%-100% by volume of a reactant gas with the remainder being a dilution gas(es). In one specific embodiment, the absorption process gas mixture may include 80%-100% reactant gas(es) with the remainder being dilution gas(es). In another embodiment, the gas mixture may include 100% dilution gas(es) without any reactant gases being present.

When the first gas mixture is introduced into the plasma chamber 102, the vacuum system 108 may be used to achieve a process pressure of greater than or equal to 1 mTorr to facilitate the initial adsorption process. The controller 132 may optimize the gas flow and the pumping speed to obtain a relatively stable pressure within the process chamber 102. The pressure may range up to 500 mTorr depending on the substrate 110 composition and the desired adsorption rate for the adsorbed layer 306. Also, the chamber pressure may vary based on the transition between the adsorption and desorption process. However, the pressure may vary depending on the desired flux conditions and ion energy during the adsorption process. In one embodiment, the process pressure may also change during the adsorption process to adjust the surface coverage of the substrate 110 with the adsorption layer 306. For example, the initial pressure may be at least 1 mTorr and may transition to a higher pressure during the adsorption process.

At block 506, the first power source 122 may apply microwave power to the first gas mixture through the power assembly 114 disposed in the process chamber 102. Plasma generated as a result of the power application may be used to form the adsorbed layer 306 as described in the description of FIG. 3. Forming the adsorption layer 306 may include any molecular or atomic composition in view of the substrate 110 composition (e.g., Si) and the reactant gas (e.g., $Cl_x$, $F_x$, $O_x$), such that the etch selectivity between the adsorbed layer 306 and the substrate 110 may be leveraged to remove the adsorbed layer 306 during a subsequent desorption process with minimal damage or alteration to the substrate 110.

Broadly, the microwave power may range between 500 W and 10,000 W and have a driving frequency of at least 300 MHz up to 10 GHz. In one specific embodiment, the driving frequency may be about 2.45 GHz for any power setting between 500 W and 10,000 W. Ideally, the applied microwave power and driving frequency should enable the generation of the first plasma 302, such that the ion energy within the first plasma region 206 may be less than 20 eV and that radical flux is higher than the ion flux proximate to the substrate 110 or at least within the first plasma processing region 206. In one particular embodiment, the first gas plasma may have a plasma potential that is less than or equal to 15V.

The first plasma 302 process time may vary depending on the process conditions and the substrate 110 composition and the adsorbed layer 306 composition. The adsorption time may vary between 100 ms and 3000 ms. Ideally, a shorter adsorption time of less than 1000 ms may desirable for process cycle time considerations. However, in most embodiments at or above the 40 mTorr threshold may include a process time of less than 500 ms. Once the adsorbed layer 306 formed, the adsorption process may transition to the desorption process. The power and pressure combinations may also be optimized to increase the ion energy from the adsorption process (e.g., first plasma 302) to the desorption process (e.g., second plasma 304). For example, the desorption process ion energy may be greater than 15 eV may have a higher ion flux towards the substrate 110 than during the adsorption process. In more specific desorption embodiment, the ion energy may range from 20 eV up to 70 eV, but should likely remain below a sputter threshold to prevent damage to or contamination of the substrate 110 from undesirable elements.

After the adsorbed layer 306 has been formed, the adsorption process may transition to a desorption process within the same plasma chamber 102. As noted above, the transition may occur by shifting to a higher ion flux that may be used to remove the adsorbed layer 306. The transition may include, but is not limited to, process changes in power, pressure, chemistry, substrate location, or any combination thereof. However, in the FIG. 5 embodiment, the combination of chemistry and location changes are described. However, in other embodiments, the changes in chemistry and location may be done in conjunction with changes in power and/or pressure.

At block 508, the gas delivery system 104 may provide a second gas mixture or chemical composition to the plasma chamber 102. The second gas mixture may include a dilution gas(es) that may be used to generate the second plasma 304 or desorption plasma that may be used to remove the adsorbed layer 306 from the substrate 110. The dilution gas may include, but is not limited to, argon, helium, nitrogen, or any combination thereof.

When the second gas mixture is introduced into the plasma chamber 102, the vacuum system 108 may be used to achieve a process pressure of greater than or equal to 1 mTorr to facilitate the desorption process. The controller 132 may optimize the gas flow and the pumping speed to obtain a relatively stable pressure within the process chamber 102. The pressure may range up to 500 mTorr depending on the substrate 110 composition and the desired desorption rate of the adsorbed layer 306.

In one specific embodiment, the transition between gas mixture may include varying the gas mixture in-situ by changing the incoming flows of the gases, such that gas mixture may not be entirely purged from the plasma chamber 102, but that the gas mixture concentration has transitioned from an adsorption process condition to a desorption process condition. For example, the adsorption process condition may include gas mixture comprising a reactant gas mixture concentration of greater than 10% by volume. The controller 132 may alter the gas flow from the gas delivery system 104 to change decrease the reactant gas mixture concentration to be less than 10% by volume for the desorption process. In some embodiments, the controller 132 may also vary the chamber pressure and/or the first source power 122 between the adsorption process (e.g., first plasma 302) and the desorption process (e.g. second plasma 304). For example, the adsorption process may include a chamber pressure of at least 40 mTorr and the controller 132 may adjust the gas flow rates or pumping conductance to alter the chamber pressure to a desorption process pressure that differs from the adsorption process pressure by at least 10%.

In another embodiment, the gas mixture may have the same or similar gas mixture concentrations (by volume) during the adsorption and the desorption processes. For example, the reactant gas(es) and the dilution gas(es) may be have the same concentration between the adsorption process and the desorption process, such that the gas mixture concentration may be within 20% by volume between the two process steps. When the gas mixture for the adsorption and desorption process may be the same or similar, the source power (e.g., power to the power assembly 114) may be increased and the pressure may be decreased to transition between adsorption and desorption at the surface of the substrate 110.

In another embodiment, the change between the first plasma 302 and the second plasma 304 may be a continuous plasma, in that the first plasma 302 may not be extinguished during the transition to the second plasma 304. The controller 132 may vary the gas mixture, pressure, power, or combination thereof to maintain a plasma state within the process chamber 102 during the transition between adsorption and desorption or desorption to adsorption. However, in other embodiments, the first plasma 302 may be extinguished (e.g., no applied power to the gas mixture) and the adsorption gas mixture may be purged prior to introducing the desorption gas mixture or to applying power to the desorption gas mixture. In one specific instance, the purge time may be less than 4 s, such that the purge time may be measured from the extinguishing of the first plasma 302 to the introduction of the desorption gas mixture in the plasma chamber 102. However, in certain embodiments, the purge time may be measured between the extinguishing of the first plasma 302 and the initiation of the second plasma 304.

In another embodiment, purge times may or may include transient conditions within the power supplies 106 that provide electromagnetic energy to the gas mixture. The transient conditions may include power spikes when the power supplies 106 may be turned on or off or when the applied power may be transitioned between different setpoints without being turned off. Any transient issues (e.g., overshoot, undershoot, or stabilization times) for the power supplies 106 may be managed by circuitry, filters, or software that may be implemented by a person of ordinary skill in the art of plasma processing systems. The person of ordinary skill in the art may design transient control capabilities to make the transient times to be much less than the on and off times of the power supplies 106 during the adsorption and/or desorption processes.

In another embodiment, the use of a second gas mixture may not be used to transition from the adsorption plasma to the desorption plasma. This embodiment may leverage the different ion energy or plasma potential within the first plasma to from and remove the adsorbed layer 306. As noted above, this process may be possible due to the ion energy is higher closer to the source electrode 126 than the substrate chuck 124. In this way, the adsorbed layer 306 may be formed when the substrate 110 is closer to the substrate chuck 124 and then removed when the substrate 110 is moved closer to the source electrode 126. This embodiment will be described in the description of FIG. 6.

At block 510, the lifting component 138 may move the substrate 110 from the first position (e.g., first plasma region 206) to a second position (e.g., second plasma region 208) within the plasma chamber 102. Substrate 100 movement may be implemented in a variety ways that may coincide with other process changes occurring during the adsorption/desorption transition. The process changes may include, but are not limited to, gas mixture, pressure, power, or any combination thereof. In one embodiment, moving from the first position to the second position may occur before, during, or after the second gas mixture is introduced to the plasma chamber 102. For example, the movement may occur after the second gas mixture is injected into the plasma chamber 102 to limit the impact of the reactant gases on the substrate 110 when it moves closer to the source electrode 126. Higher energy levels closer to the source electrode 126 may cause the reactant chemicals to have undesirable impact on the substrate 110. In this instance, delaying substrate 110 movement until after the less reactive chemistry (e.g., second gas mixture) has been diluted or purged to a sufficient level to prevent exposing the substrate 110 to higher energy reactant ions, atoms, or molecules. Further, substrate 110 movement may be delayed until any pressure or power changes have stabilized during the injection of the second gas mixture. However, in other embodiments, substrate 110 movement may occur before or during the introduction of the second gas mixture to the plasma chamber 102.

Broadly, the second position may be anywhere within the chamber where the transition between adsorption and desorption may occur based, at least in part, on the ion energy, sticking coefficient(s) of radicals, etch yield (Y), the radical-to-ion flux ratio (RIR) expressed as the ion flux over the radical flux $$\left(\frac{\Gamma_i}{\Gamma_r}\right),$$

or any combination thereof. Generally, the second position may be located within 100 mm of the surface of the source electrode 126, but this limitation is not absolute and depends on what conditions a person of ordinary skill in the art would enable movement across the transition line 402 between adsorption and desorption conditions. However, in one specific embodiment, the second position may be between 20 mm and 100 mm away from the surface of the source electrode 126, more particularly between 30 mm and 70 mm.

At block 512, the adsorbed layer 306 may start to be removed when the first plasma 302 (e.g., adsorption) transitions to the second plasma 304 (e.g., desorption) as described in the description of FIG. 3. The second gas mixture may be used to form the second plasma 304 that may include a higher ion density and flux that may directed towards the substrate 110. Portions of the adsorbed layer 306 may be removed until the underlying substrate 110 is exposed. A person of ordinary skill in the art would select the process conditions (e.g., power, pressure, etc.) to achieve selectivity between the adsorbed layer 306 and the underlying substrate 110.

FIG. 6 is a flow diagram for another method 600 for generating a adsorption plasma (e.g., first plasma 302) to form the adsorbed layer 306 on the substrate 110 and a desorption plasma (e.g., second plasma 304) to remove the adsorbed layer 306 from the substrate 110. In one embodiment, the adsorption and desorption plasma may generated at the same time within the plasma chamber 102. Under certain process conditions, plasma characteristics may vary sufficiently within the chamber to form discrete regions that may be used to process the substrate 110 in different ways with no or small amount of changes to the process conditions. The lifting component 138 may be used to transfer the substrate 110 between the two regions to enable an adsorption and a desorption process. As noted above in the description of FIG. 1, plasma may be generated using a variety of techniques using different types of hardware that may or may not use the same process conditions. Broadly, the scope of the claims may cover embodiments that may use hardware that may not be described in this disclosure. For example, plasma characteristics described in the method 600 may cover several hardware and/or process condition embodiments. Accordingly, the scope of the claims may not be limited to the hardware and/or process condition embodiments described herein.

At block 602, the plasma process chamber 102 may receive a substrate 110 which may include any type of semiconductor substrate that may include patterned features or elements that may be used to form microelectronic devices. The semiconductor substrate 110 may include, but is not limited to, any single element substrate (e.g., Si), silicon on insulator substrates, III-V substrates, or epitaxial silicon substrates. The substrate 110 may be placed on the substrate holder 124 that may disposed between the power assembly 114 in the substrate holder 124.

In one embodiment, the substrate 110 may be placed in a first position within the plasma chamber 102. As shown in FIG. 2, the substrate 126 may be opposite the source electrode 126 and may be located where adsorption process may dominate the desorption process on the surface of the substrate 110. The adsorption process may likely dominate in the first plasma region as shown in FIG. 2 when the process is initiated. In one embodiment, the first position of the substrate 110 may be at least 100 mm, in a vertical or normal direction, from the source electrode 126. More particularly, in one specific embodiment, the first position of the substrate 110 may be between 100 mm and 200 mm from the source electrode 126.

At block 604, the plasma chamber 102 may receive gas from the gas delivery system 104 that may be injected into different locations relative to the first plasma region 206 and the second plasma region 208. In one embodiment, the gases may include reactant gases (e.g., Cl, Br, CFx, F, O, or combination thereof) and dilution gases (e.g., Ar or $N_2$) that may enable the adsorption and desorption processes. As noted above, a gas mixture that includes a combination of reactant and dilution gases may be used to form the adsorbed layer 306. For example, the adsorbed layer 306 is more likely to be formed if a higher concentration of reactant gases are used at a relatively low plasma potential (e.g., <15V). One approach to enable this may be to inject the reactant gases closer to the first plasma region 204 to increase the likelihood of a higher reactant gas concentration to enable adsorption.

In one embodiment, the reactant gases may be injected at a steady state throughout the process and the plasma differences between the first plasma region 206 and second plasma region 208 may be driven by other process conditions (e.g., power, pressure, substrate location, etc.). However, the steady flow of reactant gases is not required to implement the adsorption/desorption process. In other instances, the gas flow rates of the process gases may be changed when the substrate moves from the first plasma region 206 to the second plasma region 208. In one embodiment, the reactant gas flow rate may be reduced to lower the concentration of reactant gases in the plasma chamber 102. In the alternative, the dilution gas flow may increase to lower the concentration of reactant gases in the plasma chamber 102. The gas flow may vary between the values in the same or similar manner as described in the description of FIG. 5.

At block 606, plasma may be generated by applying a pulsed power from a surface wave plasma source (e.g., power source 106) to the gas within the plasma chamber 102. In this instance, the plasma within the chamber may have inherent differences in the potential or ion energy across the plasma chamber 102. For example, the potential or ion energy may have different magnitudes within the different regions of the plasma chamber 102. The power transmitted from the source electrode 126 may form a first plasma region 206 and a second plasma region 208, such that when the substrate 110 is placed within those regions the process results will vary. As noted above, the first plasma region 206 may induce adsorption of the ion or molecules into the substrate 110 to form the adsorbed layer 306. In contrast, when the substrate 110 is placed in the second plasma region 208 the plasma within the second region 208 may desorb or remove the adsorbed layer 306 in a selective manner with respect to the underlying substrate 110. As shown in FIG. 2, the first plasma region 206 and the second plasma region 208 may be opposite each other within the plasma chamber 102. Hence, when the substrate 110 is moved, via the lifting component 138, the process conditions may transition between adsorption and desorption based, at least in part, on which region the substrate 110 resides at the time. In one embodiment, the plasma power process conditions may be the same or similar to the plasma power conditions described in the description of FIG. 5.

At block 608, following the formation of the absorbed layer 306, the substrate 110 may move from the first plasma region 206 to the second plasma region 208 to initiate the desorption process that will expose the underlying substrate 110. In one embodiment, the process conditions during or after the movement will be the same or similar to the process conditions when the substrate 110 was located within the first plasma region 206. In this instance, the change in plasma characteristics may be based, at least in part, on the power distribution within the plasma chamber 102, such that the plasma that is closer to the source electrode 126 will have a higher potential or ion energy than the plasma proximate to the substrate chuck 124 or within the first plasma region 206. However, in other embodiments, the process conditions may vary when the substrate 110 is moved within the plasma chamber 102.

In another embodiment, the magnitude and/or frequency of the pulsed power may vary when the substrate 110 is moved between the first plasma region 206 and the second plasma region 208. The pulsed power may vary within the power ranges described in the description of FIGS. 1-5. In another embodiment, the pressure in the plasma chamber 102 may vary when the substrate 110 is moved between the first plasma region 206 and the second plasma region 208. The pressure may vary within the pressure ranges described in the description of FIGS. 1-5. In another embodiment, the gas mixture composition in the plasma chamber 102 may vary when the substrate 110 is moved between the first plasma region 206 and the second plasma region 208. The gas mixture composition may vary within the gas mixture composition ranges described in the description of FIGS. 1-5. In another embodiment, a combination of process conditions (e.g., power, pressure, gas mixture composition) may vary when the substrate 110 is moved between the first plasma region 206 and the second plasma region 208. The process conditions may vary within the process condition ranges described in the description of FIGS. 1-5.

In the FIG. 6 embodiments, the substrate 110 may alternate between the adsorption plasma (e.g., first plasma 302 and the desorption plasma (e.g., second plasma 304) in over a period of time until a desired amount of the substrate 110 is removed. The iterations of each adsorption or desorption process may incorporate the same plasma conditions for each iteration, however each iteration may vary within the process condition boundaries described in any of the embodiments disclosed herein.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A method for treating a substrate, comprising:
   placing the substrate in a first position within a plasma processing chamber, the substrate having a surface layer of a first thickness;
   receiving a first chemical composition in the plasma processing chamber, the first chemical composition comprising at least a first constituent and a second constituent;
   applying power from a surface wave plasma source to the first chemical composition to generate plasma that treats a top portion of the surface layer;
   receiving a second chemical composition in the plasma processing chamber, the second chemical composition being different from the first chemical composition;
   moving the substrate to a second position within the plasma processing chamber; and
   removing the treated top portion of the surface layer using the second chemical composition to reduce the surface layer to a second thickness less than the first thickness.

2. The method of claim 1, wherein the plasma comprises a potential less than or equal to 15V.

3. The method of claim 1, wherein the receiving of the second chemical composition comprises reducing a flow rate for at least one constituent of the first chemical composition into the plasma processing chamber.

4. The method of claim 3, wherein the at least one constituent is injected into the plasma processing chamber closer to the first position than the second position.

5. The method of claim 1, wherein the first position comprises a location that is more than 100 mm from the electrode of the surface wave plasma source, and the second position is between 20 mm and 100 mm from the electrode.

6. The method of claim 1, wherein the first chemical composition comprises one or more reactive elements comprising Cl, Br, $CF_x$, F, or O radicals.

7. The method of claim 6, wherein the second chemical composition comprises Ar, $N_2$, and a lower concentration of the reactive elements than in the first chemical composition.

8. The method of claim 1, wherein the plasma comprises an ion energy between 1 eV to 20 eV during the treating of the top portion of the surface layer.

9. The method of claim 8, wherein the plasma comprises an ion energy between 10 eV to 100 eV during the removing of the treated top portion of the surface layer.

10. A method for treating a substrate, comprising:
placing the substrate in a plasma processing chamber, the substrate having a surface to be etched;
receiving a gas into the plasma processing chamber;
generating a first plasma in a first region of the plasma processing chamber, the first plasma comprising a first potential less than or equal to 15V and capable of forming an adsorbed layer within the surface to be etched;
generating a second plasma in a second region of the plasma processing chamber, the second plasma comprising a second potential that is greater than the first potential and capable of desorbing the adsorbed layer from the surface to be etched; and
moving the substrate between the first region and the second region within the plasma processing chamber to reduce a thickness of the surface to be etched.

11. The method of claim 10, further comprising forming the adsorbed layer within the surface to be etched when the substrate is located in the first region.

12. The method of claim 11, further comprising desorbing the adsorbed layer from the surface to be etched when the substrate is located in the second region.

13. The method of claim 10, wherein the moving of the substrate comprises changing a magnitude of the pulsed power when the substrate moves between the first region and the second region.

14. The method of claim 10, wherein the moving of the substrate comprises changing pressure in the plasma processing chamber when the substrate moves between the first region and the second region.

15. The method of claim 10, wherein the gas comprises a mixture of two or more of the following gases: Cl, Br, $CF_x$, F, O, Ar, or $N_2$.

16. The method of claim 15, wherein the moving of the substrate comprises changing concentration of the mixture when the substrate moves between the first region and the second region.

17. A method for treating a substrate, comprising:
placing the substrate in a plasma processing chamber;
receiving a gas into the plasma processing chamber, wherein the gas comprises a mixture of two or more of the following gases: Cl, Br, $CF_x$, F, O, Ar, or $N_2$;
generating a first plasma in a first region of the plasma processing chamber, the first plasma comprising a plasma potential less than or equal to 15V for an adsorption process;
generating a second plasma in a second region of the plasma processing chamber, the second plasma comprising a plasma potential for a desorption process that is greater than the plasma potential for the adsorption process; and
moving the substrate between the first region and the second region within the plasma processing chamber, wherein the receiving of the gas comprises injecting the Cl, Br, $CF_x$, F, or O closer to the first region than where the Ar or $N_2$ are injected into the plasma processing chamber.

18. The method of claim 10, wherein the first plasma region is opposite the second plasma region.

19. The method of claim 10, wherein the generating of the first plasma comprises applying a first pulsed power from a surface wave plasma source to the gas.

20. The method of claim 10, wherein the generating of the second plasma comprises applying a second pulsed power from a surface wave plasma source to the gas, the second pulsed power being similar to the first pulsed power.

* * * * *